(12) United States Patent
Cho et al.

(10) Patent No.: US 9,999,133 B2
(45) Date of Patent: Jun. 12, 2018

(54) FLEXIBLE PRINTED CIRCUIT BOARD AND DISPLAY DEVICE HAVING THE SAME

(71) Applicant: Samsung Display Co., Ltd., Yongin-si, Gyeonggi-do (KR)

(72) Inventors: Jaehyung Cho, Suwon-si (KR); Ahyoung Son, Seoul (KR); Heesoon Jeong, Hwaseong-si (KR); Myungho Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/282,407

(22) Filed: Sep. 30, 2016

(65) Prior Publication Data
US 2017/0135216 A1 May 11, 2017

(30) Foreign Application Priority Data
Nov. 5, 2015 (KR) .................. 10-2015-0155329

(51) Int. Cl.
*H05K 1/18* (2006.01)
*H05K 1/14* (2006.01)
*H05K 1/11* (2006.01)

(52) U.S. Cl.
CPC ............ *H05K 1/189* (2013.01); *H05K 1/113* (2013.01); *H05K 1/147* (2013.01); *H05K 2201/10128* (2013.01)

(58) Field of Classification Search
CPC ...... H05K 1/0277; H05K 1/028; H05K 1/189; H05K 1/118; H05K 1/0393
See application file for complete search history.

(56) References Cited

U.S. PATENT DOCUMENTS

| 6,603,710 | B1* | 8/2003 | Pantet | G02F 1/13452 |
| | | | | 349/191 |
| 7,256,345 | B2* | 8/2007 | Inoue | B32B 15/02 |
| | | | | 174/110 R |
| 2012/0247824 | A1* | 10/2012 | Ohsawa | G11B 5/486 |
| | | | | 174/264 |
| 2016/0316577 | A1* | 10/2016 | Yamamoto | G09G 5/006 |
| 2016/0352031 | A1* | 12/2016 | Ito | H01R 4/04 |

FOREIGN PATENT DOCUMENTS

| KR | 10-1999-0038004 A | 6/1999 |
| KR | 10-2015-0031115 A | 3/2015 |
| KR | 10-2015-0085668 A | 7/2015 |

\* cited by examiner

*Primary Examiner* — Timothy Thompson
*Assistant Examiner* — Amol Patel
(74) *Attorney, Agent, or Firm* — Lewis Roca Rothgerber Christie LLP

(57) ABSTRACT

A flexible printed circuit board includes a base substrate, a first pad part on the base substrate, a second pad part on the base substrate, and a line part on the base substrate, the line part electrically connecting the first pad part and the second pad part. The base substrate includes a first body part including the first pad part thereon and having a curved edge, a second body part including the second pad part thereon, and a connection part between the first pad part and the second pad part and having a width decreasing as a distance from the first body part increases and a distance from the second body part decreases.

16 Claims, 14 Drawing Sheets

US 9,999,133 B2

FLEXIBLE PRINTED CIRCUIT BOARD AND DISPLAY DEVICE HAVING THE SAME

CROSS-REFERENCE TO RELATED APPLICATION

This U.S. Non-Provisional patent application claims priority under 35 U.S.C. § 119 to and the benefit of Korean Patent Application No. 10-2015-0155329, filed on Nov. 5, 2015, the content of which is hereby incorporated by reference in its entirety.

BACKGROUND

1. Field of Disclosure

Embodiments of the present disclosure relate to a flexible printed circuit board including a base substrate including a plurality of body parts and a display device having the flexible printed circuit board.

2. Description of the Related Art

In recent years, various devices which include display devices, such as smart watches, mobile phones, navigation units, game units, car dashboards, etc., have been developed. The display devices may have various shapes as applications become more complex in addition to a conventional rectangular shape. Particularly, display devices having a curved edge are applied to a variety of fields.

SUMMARY

Embodiments of the present disclosure provide a flexible printed circuit board having a shape corresponding to a curved shape of a display panel and being capable of reducing stress while being coupled to the display panel. Embodiments of the present disclosure provide a display device having the flexible printed circuit board.

Embodiments of the inventive concept provide a flexible printed circuit board including a base substrate, a first pad part on the base substrate, a second pad part on the base substrate, and a line part on the base substrate, the line part electrically connecting the first pad part and the second pad part. The base substrate includes a first body part including the first pad part thereon and having a curved edge, a second body part including the second pad part thereon, and a connection part between the first pad part and the second pad part and having a width decreasing as a distance from the first body part increases and a distance from the second body part decreases.

The second body part includes a first body area extending from the connection part, a second body area at which the second pad part is disposed, and a third body area between the first body area and the second body area, the third body area having a width increasing as a distance from the first body area increases and a distance from the second body area decreases.

The first pad part includes first pads and second pads, which are on the base substrate, the second pad part includes third pads and fourth pads, which are on the base substrate, and the line part includes first lines connecting the first pads and the third pads and second lines connecting the second pads and the fourth pads.

The first lines and the second lines are on one surface of the base substrate.

The first lines are alternately arranged with the second lines.

The first lines are on one surface of the base substrate, and at least one second line of the second lines includes a first portion on the one surface of the base substrate, a second portion on an other surface of the base substrate, and a third portion in a via hole in the base substrate, the third portion connecting the first portion and the second portion.

At least one line of the first lines and at least one line of the second lines are disposed such that at least portions thereof face each other in a thickness direction of the base substrate.

The first pads, the second pads, and the third pads are on one surface of the base substrate and the fourth pads are on an other surface of the base substrate.

Each of the second lines electrically connecting the second pads and the fourth pads includes a first portion on the one surface of the base substrate, a second portion on the other surface of the base substrate, and a third portion connecting the first portion and the second portion in the first body part, the third portion being in a via hole in the base substrate.

The pads of the first pad part are arranged along the curved edge of the first body part and spaced apart from each other by a first distance, the pads of the second pad part are spaced apart from each other by a second distance, and the second distance is equal to or smaller than the first distance.

Embodiments of the inventive concept provide a display device including a display panel including a curved edge and a flexible printed circuit board electrically connected to the display panel. The flexible printed circuit board includes a base substrate, a first pad part on the base substrate, a second pad part on the base substrate, and a line part on the base substrate to electrically connect the first pad part and the second pad part. The base substrate includes a first body part including the first pad part thereon, the first pody part having a curved edge, a second body part including the second pad part thereon, and a connection part between the first pad part and the second pad part, the connection part having a width decreasing as a distance from the first body part increases and a distance from the second body part decreases.

The display panel includes a display area for displaying an image and a non-display area outside the display area, and the first body part of the base substrate corresponding to the non-display area.

The display panel includes a panel pad part at the curved edge and the panel pad part is electrically connected to the first pad part.

The display device further includes a main circuit board electrically connected to the flexible printed circuit board, and the first pad part is electrically connected to the display panel and the second pad part is electrically connected to the main circuit board.

The first pad part includes first pads and second pads, which are on one surface of the base substrate, the second pad part includes third pads and fourth pads, which are on the one surface of the base substrate, and the line part includes first lines connecting the first pads and the third pads and second lines connecting the second pads and the fourth pads through via holes in the base substrate.

At least one second line of the second lines includes a first portion on the one surface of the base substrate, a second portion on an other surface of the base substrate, and a third portion connecting the first portion and the second portion, the third portion being in a corresponding via hole of the via holes in the base substrate.

The first pads, the second pads, and the third pads are on the one surface of the base substrate and the fourth pads are on the other surface of the base substrate.

The edge of the display panel has a circular shape and the display panel is provided with a hole in a center portion thereof and has a substantially ring shape.

According to the above, the flexible printed circuit board has the curved edge and the width of the body part of the base substrate decreases, and thus the flexible printed circuit board may be applied to the display panel having the curved shape.

Therefore, the curved shape of the display device may be maintained after the flexible printed circuit board is applied to the display device, and the stress occurring when the flexible printed circuit board is coupled to the display panel may be reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
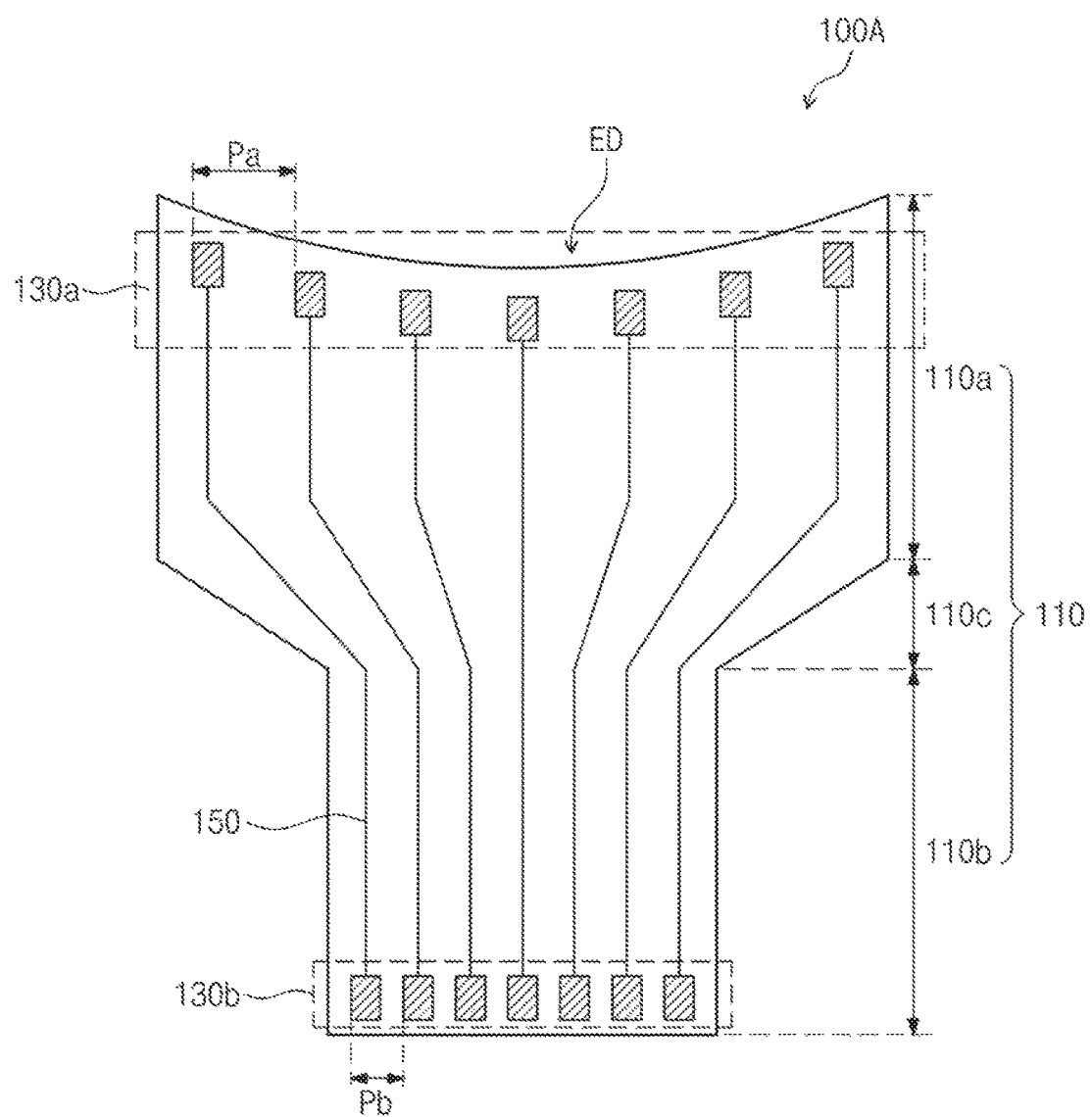
FIG. 1 is a plan view showing a flexible printed circuit board according to an exemplary embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure.

In the drawings, the thickness of layers, films, and regions are exaggerated for clarity. Like numerals refer to like elements throughout.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present. In addition, although any layer is shown to be flat, it is not necessary that it be flat and a step difference may occur on a relatively upper layer due to a surface shape of a relatively lower layer during a stacking process.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the present invention.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

A relevant device or component (or relevant devices or components) according to embodiments of the present invention described herein may be implemented utilizing any suitable hardware, firmware (e.g. an application-specific integrated circuit), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Hereinafter, the embodiments of the present invention will be explained in detail with reference to the accompanying drawings.

Figure 2:
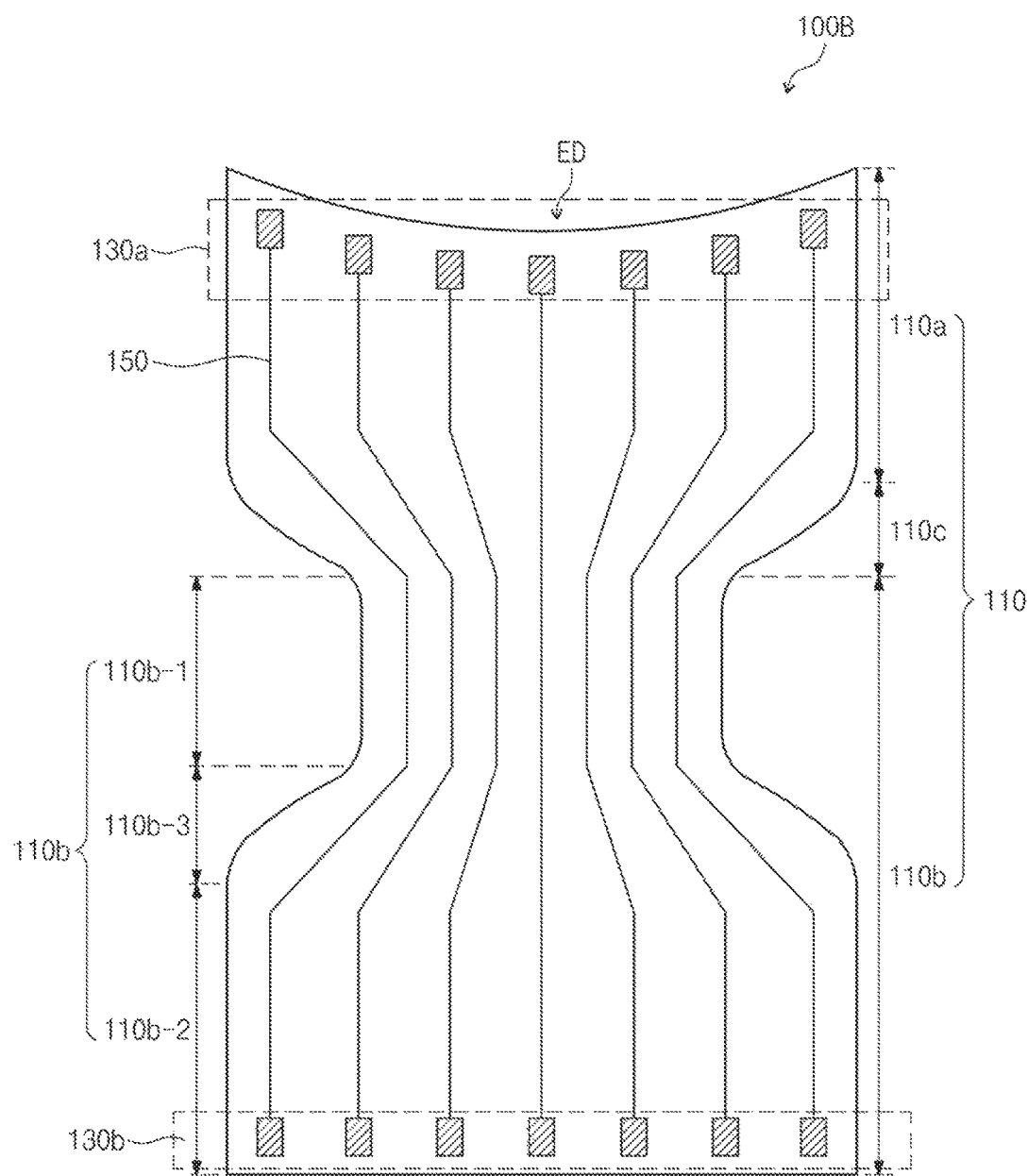
FIG. 2 is a plan view showing a flexible printed circuit board according to an exemplary embodiment of the present disclosure.

FIG. 1 is a plan view showing a flexible printed circuit board 100A according to an exemplary embodiment of the present disclosure and FIG. 2 is a plan view showing a flexible printed circuit board 100B according to an exemplary embodiment of the present disclosure.

Each of the flexible printed circuit boards 100A and 100B according to exemplary embodiments of the present disclosure includes a base substrate 110, a first pad part 130a disposed on the base substrate 110, a second pad part 130b disposed on the base substrate 110, and a line part 150 disposed on the base substrate 110 to electrically connect the first pad part 130a to the second pad part 130b. In addition, the base substrate 110 includes a first body part 110a having a curved edge ED, on which the first pad part 130a is disposed, a second body part 110b on which the second pad part 130b is disposed, and a connection part 110c disposed between the first and second body parts 110a and 110b and having a width that decreases as a distance from the second body part 110b decreases.

In the flexible printed circuit board 100B of FIG. 2, the second body part 110b of the base substrate 110 includes a first body area 110b-1 extending from the connection part 110c of the base substrate 110, a second body area 110b-2 in which the second pad part 130b is disposed, and a third body area 110b-3 disposed between the first body area 110b-1 and the second body area 110b-2 and having a width that increases as a distance from the second body area 110b-2 decreases.

The second body part 110b of the flexible printed circuit board according to the present exemplary embodiment may include the second body area 110b-2 in which the second pad part 130b is disposed and the third body area 110b-3 having a width that decreases as a distance from the connection part 110c of the base substrate decreases. That is, the second body part 110b of the flexible printed circuit board 100B according to an exemplary embodiment may or may not include the first body area 110b-1 having the width that is smaller than that of the first body part 110a and a constant width.

Accordingly, the flexible printed circuit board may include the first body part 110a including the first pad part 130a, the connection part 110c having the width that gradually decreases from the first body part 110a, the third body area 110b-3 of the second body part 110b extending from the connection part 110c and having the width that gradually increases, and the second body area 110b-2, in which the second pad part 130b is disposed, connected to the third body area 110b-3.

That is, as a modified embodiment, the flexible printed circuit board 100B may have a base substrate from which the first body area 110b-1 of the second body part 110b is omitted. For instance, the flexible printed circuit board 100B includes the first body part 110a, the connection part 110c, and the second body part 110b and the connection part 110c is connected to the third body area 110b-3 of the second body part 110b without including the first body area 110b-1.

The base substrate 110 includes a flexible material, e.g., polyimide. The base substrate 110 includes one surface and an other surface facing the one surface.

Referring to FIGS. 1 and 2, the first body part 110a of the base substrate 110 has a curved edge ED. For instance, one end of the base substrate 110 has the curved edge ED corresponding to a portion of a circumference of a circle or a portion of a circumference (or a perimeter) of an oval, but the shape of the curved edge ED should not be limited thereto or thereby. One end of the base substrate 110 may have a curved edge ED shape.

Referring to FIG. 1, the base substrate 110 includes the first body part 110a having a constant width and the second body part 110b having a constant width that is smaller than that of the first body part 110a.

In addition, the connection part 110c of the base substrate 110 may be a part having the width that gradually decreases as a distance from the first body part 110a increases and a distance from the second body part 110b decreases. In this case, the connection part 110c may be a part connecting a lower end portion of the first body part 110a and an upper end portion of the second body part 110b and side edges of the connection part 110c may have a straight shape, but they should not be limited thereto or thereby. That is, the side edges of the connection part 110c disposed between the first and second body parts 110a and 110b may have a curved shape.

According to the flexible printed circuit board 100B of FIG. 2, the base substrate 110 includes the first body part 110a, the second body part 110b, and the connection part 110c disposed between the first and second body parts 110a and 110b, and the second body part 110b includes the first to third body areas 110b-1 to 110b-3.

Referring to FIG. 2, the first body part 110a has the constant width and the second body area 110b-2 of the second body part 110b has substantially the same width as the first body part 110a. In addition, the first body area 110b-1 of the second body part 110b has a constant width that is smaller than that of the second body area 110b-2.

For instance, an intermediate part of the base substrate 110 of the flexible printed circuit board 100B of FIG. 2, which corresponds to the first body area 110b-1 of the second body part 110b, has the width that is smaller than the width of the first body part 110a and the second body area 110b-2 of the second body part 110b, which respectively correspond to opposite ends of the base substrate 110. Therefore, the base substrate 110 has an hourglass shape in which the width thereof gradually decreases as a distance from the first body part 110a increases and a distance from the first body area 110b-1 corresponding to the intermediate part of the base substrate 110 decreases and the width thereof gradually increases as a distance from the first body area 110b-1 increases and a distance from the second body area 110b-2 of the second body part 110b decreases.

In the exemplary embodiments shown in FIGS. 1 and 2, each of the first and second pad parts 130a and 130b may include a plurality of pads.

The first pad part 130a is disposed in the first body part 110a and the second pad part 130b is disposed in the second body part 110b. For instance, the first pad part 130a is disposed at one end of the base substrate 110 and the second pad part 130b is disposed at the other end of the base substrate 110.

The first pad part 130a is disposed in the first body part 110a to be adjacent to an edge of the base substrate 110 and the second pad part 130b is disposed in the second body area 110b-2 of the second body part 110b to be adjacent to an edge of the base substrate 110.

The first pad part 130a includes a plurality of first pads 130a-1, and the plurality of first pads 130a-1 of the first pad part 130a may be a plurality of output pads. The second pad part 130b includes a plurality of third pads 130b-1, and the plurality of third pads 130b-1 of the second pad part 130b may be a plurality of input pads. For example, the first pad part included in the flexible printed circuit board of the display device described below includes the output pads connected to a display panel and the second pad part included in the flexible printed circuit board of the display device described below includes the input pads connected to a main circuit board.

The pads of each of the first and second pad parts 130a and 130b are disposed to be spaced apart from each other.

The pads of the first pad part 130a are spaced apart from each other by a first distance Pa and the pads of the second pad part 130b are spaced apart from each other by a second distance Pb.

The pads of the first pad part 130a are disposed on the first body part 110a, which corresponds to the one end of the base substrate 110, along the curved edge ED of the first body part 110a to be spaced apart from each other, and the pads of the second pad part 130b are disposed on the second body area 110b-2 of the second body part 110b, which corresponds to the other end of the base substrate 110.

In the exemplary embodiment shown in FIG. 1, the first distance Pa between the pads of the first pad part 130a is equal to or greater than the second distance Pb between the pads of the second pad part 130b. For instance, in the case in which the second distance Pb between the pads of the second pad part 130b is set to be smaller than the first distance Pa between the pads of the first pad part 130a, the line part 150 and the pads may be arranged to correspond to the width of the base substrate 110 even though the second body part 110b has a relatively small width.

The pads are spaced apart from each other at regular intervals; a distance between the pads adjacent to each other corresponds to a pitch. In the present exemplary embodiment, the pitch between the pads included in the first and second pad parts 130a and 130b is between about 200 micrometers and about 250 micrometers.

In the case in which the pitch is smaller than about 200 micrometers, a circuit-short may occur between the pads because the distance between the pads is insufficient to prevent or substantially prevent the circuit-short from occurring, and in addition to this, the pitch is smaller than 250 micrometers in order to arrange the pads in the limited width of the base substrate 110.

According to the flexible printed circuit boards 100A and 100B respectively shown in FIGS. 1 and 2, the line part 150 includes a plurality of lines, each of which is electrically connected to a corresponding pad of the plurality of first pads 130a-1 of the first pad part 130a and a corresponding pad of the plurality of third pads 130b-1 of the second pad part 130b.

The line part 150 is disposed on one surface of the base substrate 110 in the above-mentioned embodiments shown in FIGS. 1 and 2.

Figure 3:
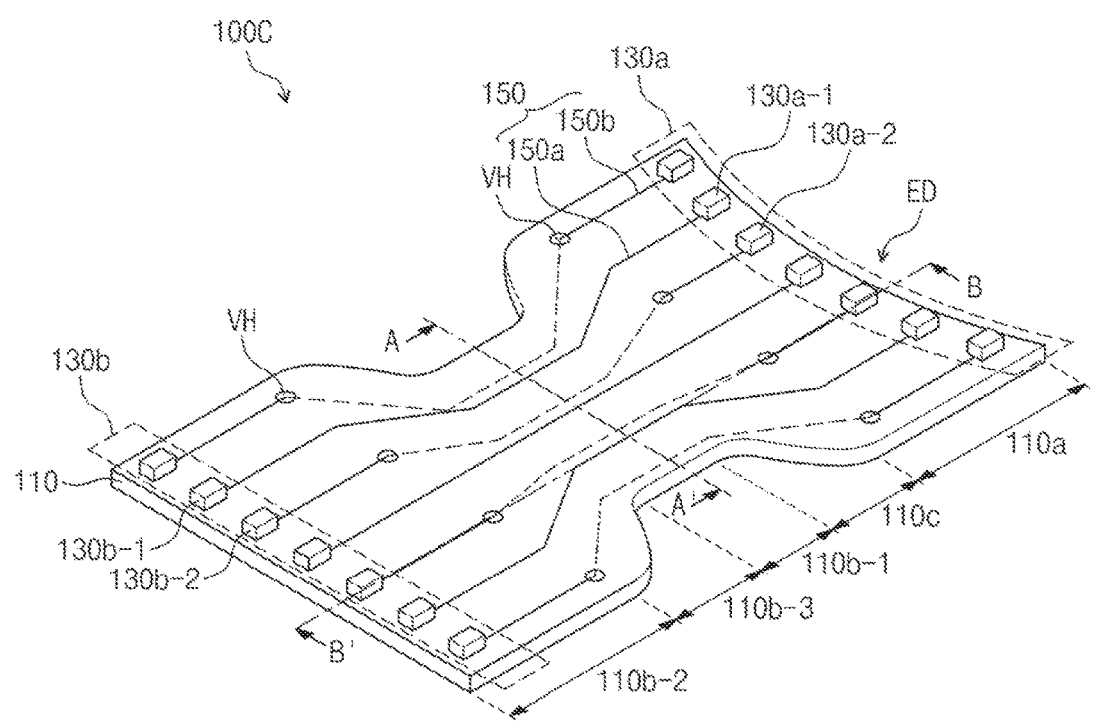
FIG. 3 is a perspective view showing a flexible printed circuit board according to an exemplary embodiment of the present disclosure.
Figure 4:
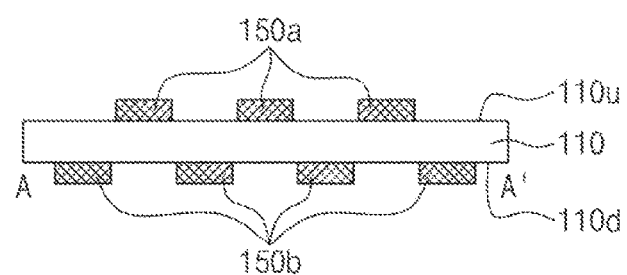
FIG. 4 is a cross-sectional view taken along the line A-A' of FIG. 3 to show the flexible printed circuit board of FIG. 3.
Figure 5:
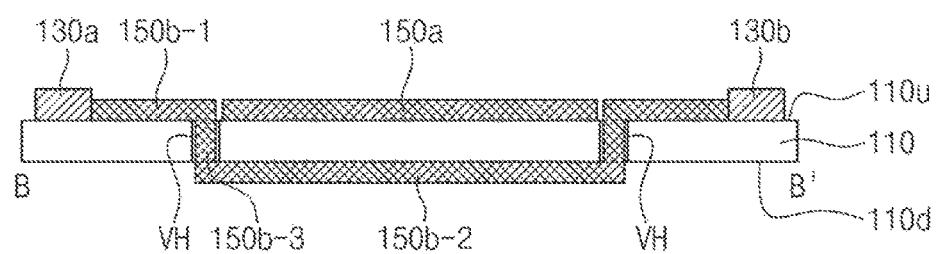
FIG. 5 is a cross-sectional view taken along the line B-B' of FIG. 3 to show the flexible printed circuit board of FIG. 3.

FIG. 3 is a perspective view showing a flexible printed circuit board 100C according to an exemplary embodiment of the present disclosure, FIG. 4 is a cross-sectional view taken along the line A-A' of FIG. 3 to show the flexible printed circuit board 100C of FIG. 3, and FIG. 5 is a cross-sectional view taken along the line B-B' of FIG. 3 to show the flexible printed circuit board 100C of FIG. 3.

Referring to FIG. 3, a first pad part 130a includes first pads 130a-1 and second pads 130a-2 and a second pad part 130b includes third pads 130b-1 and fourth pads 130b-2.

In addition, the flexible printed circuit board 100C includes first lines 150a connecting the first pads 130a-1 and the third pads 130b-1 and second lines 150b connecting the second pads 130a-2 and the fourth pads 130b-2.

The first and second pads 130a-1 and 130a-2 of the first pad part 130a are disposed on one surface of the base substrate 110 and are alternately arranged with each other.

In addition, the third and fourth pads 130b-1 and 130b-2 of the second pad part 130b are disposed on the one surface of the base substrate 110 and are alternately arranged with each other.

The first and second pads 130a-1 and 130a-2 of the first pad part 130a are arranged along the curved edge ED of the base substrate 110.

In the exemplary embodiment shown in FIG. 3, first lines 150a are disposed on the one surface of the base substrate 110 and at least one second line of second lines 150b includes a portion disposed on the one surface of the base substrate 110 and the other portion disposed on the other surface of the base substrate 110.

FIG. 4 is a cross-sectional view taken along the line A-A' of FIG. 3 to show the flexible printed circuit board 100C of FIG. 3.

Referring to FIG. 4, the first lines 150a are disposed on the one surface 110u of the base substrate 110, i.e., an upper surface of the base substrate 110, and the second lines 150b are disposed on the other surface 110d of the base substrate 110, i.e., a lower surface of the base substrate 110.

As shown in FIG. 4, at least one of the first and second lines 150a and 150b may be disposed such that at least portions thereof face each other in a thickness direction of the base substrate 110.

In detail, the first lines 150a and the second lines 150b in a first body area 110b-1 of a second body part 110b may be disposed to partially face each other in the thickness direction as shown in FIG. 4.

In addition, referring to FIG. 3, all the first and second lines 150a and 150b may be disposed on the one surface of the base substrate 110 in the first body part 110a and the second body area 110b-2 of the second body part 110b.

FIG. 5 is a cross-sectional view taken along the line B-B' of FIG. 3 to show the flexible printed circuit board 100C of FIG. 3.

Referring to FIG. 5, the first pad part 130a and the second pad part 130b are disposed on the one surface 110u of the base substrate 110 and at least one second line of the second lines 150b electrically connecting the first pad part 130a and the second pad part 130b includes a first portion 150b-1 disposed on the one surface 110u of the base substrate 110, a second portion 150b-2 disposed on the other surface 110d of the base substrate 110, and a third portion 15b-3 disposed in a via hole VH formed through the base substrate 110 between and connecting the first portion 150b-1 and the second portion 150b-2.

For instance, one line of the second lines 150b passes through two via holes VH to electrically connect the pad of the first pad part 130a and the pad of the second pad part 130b as shown in FIG. 5.

In addition, as shown in FIG. 5, the first lines 150a are disposed on the one surface 110u of the base substrate 110 and the first lines 150a and the second portion 150b-2 of the second lines 150b are disposed to face each other in the thickness direction of the base substrate 110.

Figure 6:
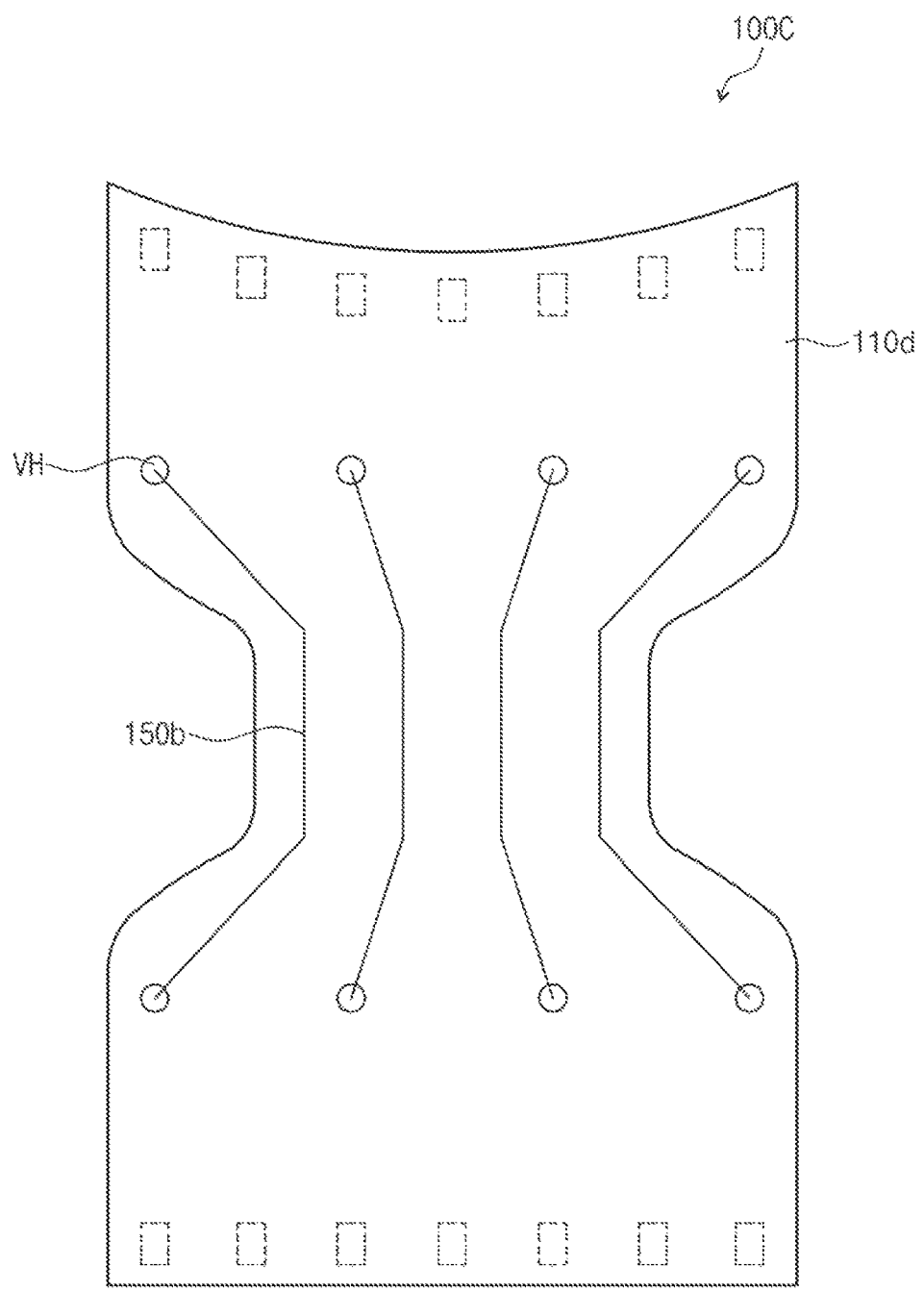
FIG. 6 is a view showing a rear portion of a flexible printed circuit board according to an exemplary embodiment of the present disclosure.

FIG. 6 is a view showing a rear portion, i.e., the other surface 110d of the base substrate 110, of the flexible printed circuit board 100C according to an exemplary embodiment of the present disclosure. As described with reference to FIG. 3, because at least one second line of the second lines 150b includes the portion disposed on the other surface 110d of the base substrate 110, the portion of the at least one second line of the second lines 150b is exposed on the rear portion of the base substrate 110 between the via holes VH formed through the base substrate 110.

As described above, the at least one second line of the second lines 150b of the flexible printed circuit board 100C shown in FIGS. 3 to 6 includes the portion disposed on the other surface 110d of the base substrate 110, and the first and second lines 150a and 150b may be efficiently arranged in the second body part having the width smaller than that of the first body part.

Figure 7:
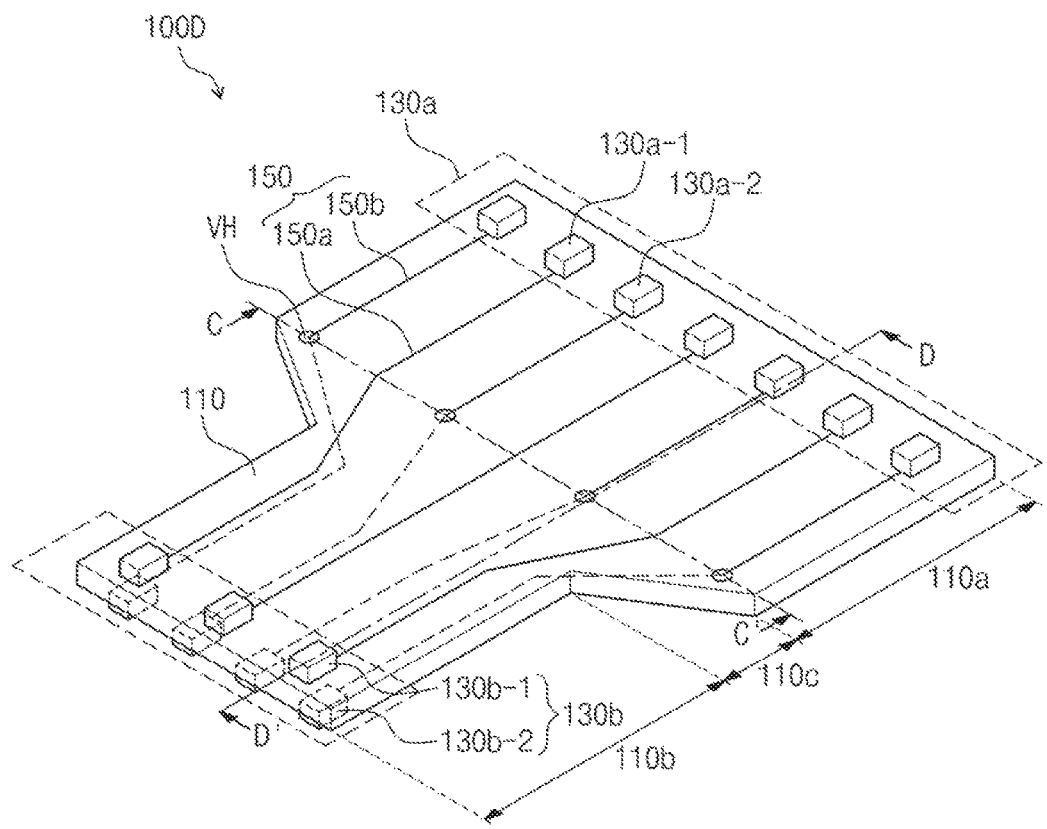
FIG. 7 is a perspective view showing a flexible printed circuit board according to an exemplary embodiment of the present disclosure.

FIG. 7 is a perspective view showing a flexible printed circuit board 100D according to an exemplary embodiment of the present disclosure.

Referring to FIG. 7, first pads 130a-1 and second pads 130a-2 of a first pad part 130a and third pads 130b-1 of a second pad part 130b are disposed on the one surface 110u (e.g., see FIGS. 8 and 9) of the base substrate 110, and fourth pads 130b-2 of the second pad part 130b are disposed on an other surface 110d (e.g., see FIGS. 8 and 9) of the base substrate 110.

In detail, according to the flexible printed circuit board 100D shown in FIG. 7, the first pads 130a-1 are alternately arranged with the second pads 130a-2 on the one surface 110u of the base substrate 110. In addition, the third pads 130b-1 electrically connected to the first pads 130a-1 by first lines 150a are disposed on the one surface 110u of the base substrate 110, and the fourth pads 130b-2 electrically connected to the second pads 130a-2 by second lines 150b are disposed on the other surface 110d of the base substrate 110.

Figure 8:
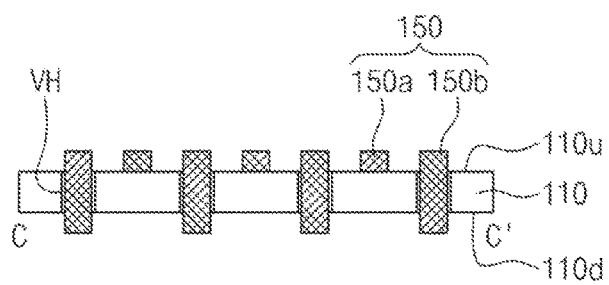
FIG. 8 is a cross-sectional view taken along the line C-C' of FIG. 7 to show the flexible printed circuit board of FIG. 7.

FIG. 8 is a cross-sectional view taken along the line C-C' of FIG. 7 to show the flexible printed circuit board 100D of FIG. 7. Referring to FIG. 8, the second lines 150b may be disposed to penetrate through the base substrate 110 and the first lines 150a may be disposed on the one surface 110u of the base substrate 110.

Figure 9:
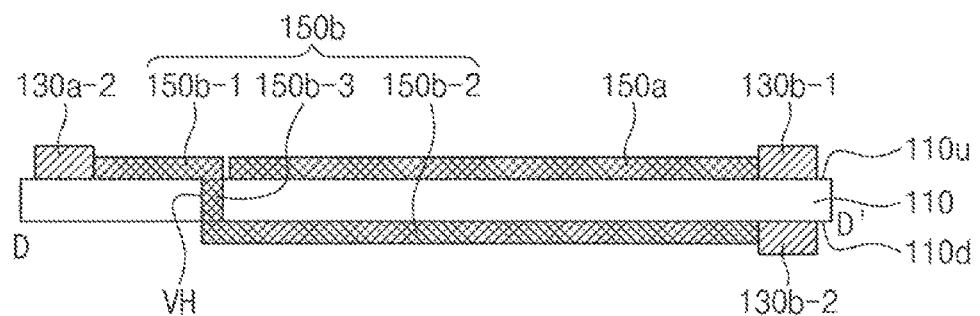
FIG. 9 is a cross-sectional view taken along the line D-D' of FIG. 7 to show the flexible printed circuit board of FIG. 7.

FIG. 9 is a cross-sectional view taken along the line D-D' of FIG. 7 to show the flexible printed circuit board of FIG. 7. Referring to FIG. 9, the first lines 150a are disposed on the one surface 110u of the base substrate 110 and the second lines 150b include a first portion 150b-1 disposed on the one surface 110u of the base substrate 110, a second portion 150b-2 disposed on the other surface 110d of the base substrate 110, and a third portion 150b-3 disposed in a via hole VH formed through the base substrate 110. In this case, the via hole VH is formed through the first body part 110a of the base substrate 110 and the third portion 15b-3 is disposed between and connecting the first and second portions 150b-1 and 150b-2.

Referring to FIG. 9, at least one of the second lines 150b electrically connect the second pad 130a-2 of the first pad part 130a and the fourth pad 130b-2 of the second pad part 130b through via hole formed through the base substrate 110.

In addition, the third pads 130b-1 of the second pad part 130b are disposed to face the fourth pads 130b-2 of the second pad part 130b in the thickness direction of the base substrate 110 as shown in FIG. 9. In the exemplary embodiment shown in FIG. 9, a portion of the first lines 150a is disposed to face the second portion 150b-2 of the second lines 150b in the thickness direction of the base substrate 110.

Accordingly, in the flexible printed circuit board 100D described with reference to FIGS. 7 to 9, a portion of the pads of the second pad part 130b is disposed on the one surface 110u of the base substrate 110 and the other portion of the pads of the second pad part 130b is disposed on the other surface 110d of the base substrate 110, and thus the pads may be efficiently arranged on the base substrate 110 even though the width of the second body part 110b of the base substrate is narrow. In addition, because the second lines 150b connecting the second pads 130a-2 of the first pad part 130a and the fourth pads 130b-2 of the second pad part 130b are connected to each other through the via holes VH formed through the base substrate 110, the line parts 150 may be arranged to correspond to the width of the body part.

Figure 10:
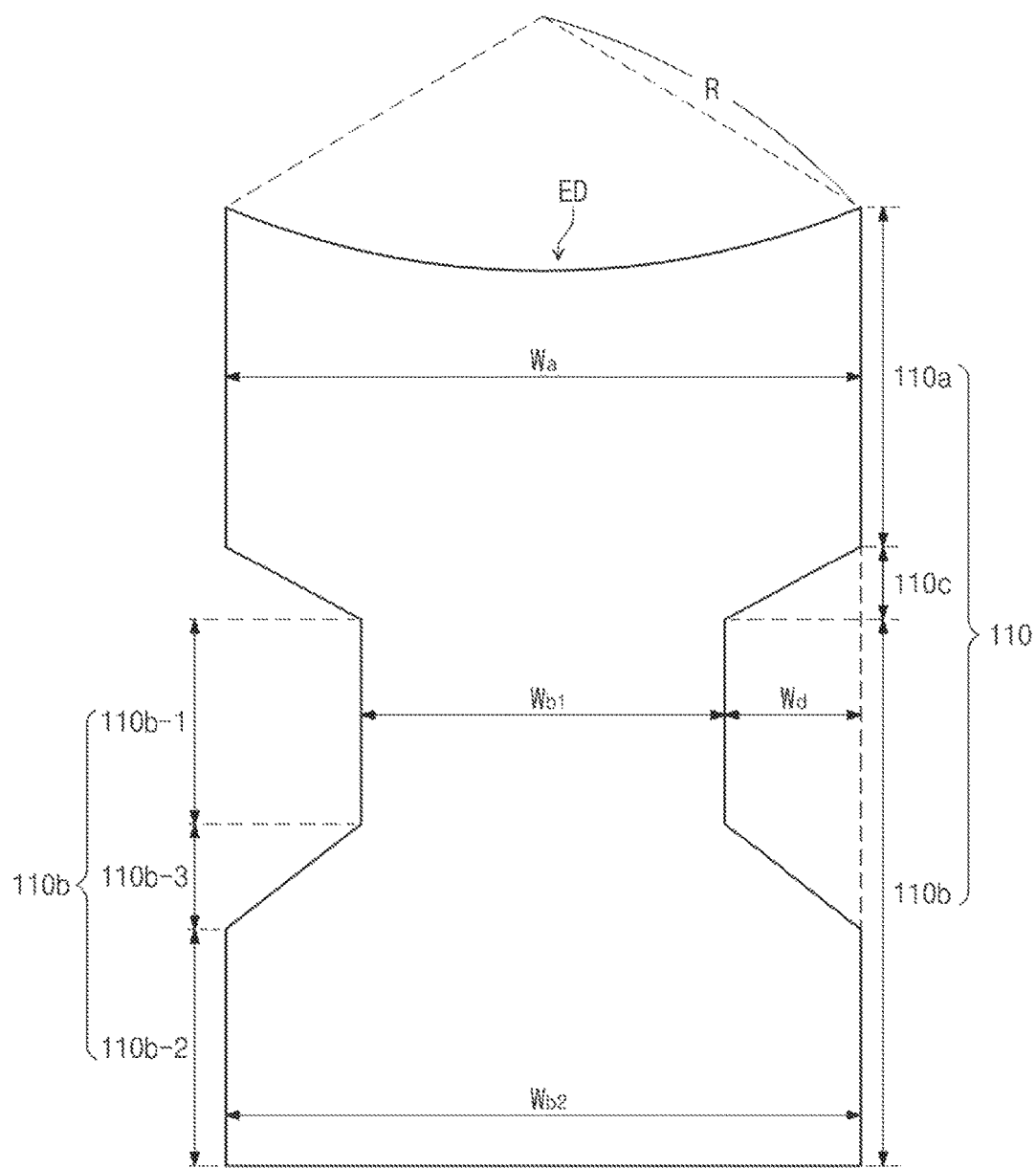
FIG. 10 is a plan view showing a base substrate included in a flexible printed circuit board according to an exemplary embodiment of the present disclosure.

FIG. 10 is a plan view showing a base substrate 110 included in a flexible printed circuit board according to an exemplary embodiment of the present disclosure.

Referring to FIG. 10, an edge ED of a first body part 110a may have a curved line. The curved line of the edge ED of the first body part 110a may be a portion of a circumference of a circle or a portion of a circumference (or perimeter) of an oval. For instance, the shape of the edge ED of the first body part 110a may be the portion of the circumference of the circle having a radius R and the radius may be equal or substantially equal to a radius of curvature of a circle of the display panel of the display device described later, when the display panel has the circular shape.

When a width of the first body part 110a is referred to as "$W_a$" and a largest width (e.g., a maximum width) of a second body part 110b is referred to as "$W_{b2}$", the width $W_a$ may be equal or substantially equal to the width $W_{b2}$.

A first body area 110b-1 of the second body part 110b has a width $W_{b1}$ and the width $W_{b1}$ is equal to or smaller than the width $W_{b2}$.

For instance, the width $W_{b1}$ of the first body area 110b-1 of the second body part may be equal to or greater than about 3.5 mm. In the case in which the width of the first body area 110b-1 is smaller than about 3.5 mm, a strength of the flexible printed circuit board may not be sufficient.

In the present exemplary embodiment shown in FIG. 10, a difference $W_d$ between the width $W_a$ of the first body part and the width $W_{b1}$ of the first body area 110b-1 of the second body part 110b may be equal to or greater than about 1.5 mm. In the case in which the different $W_d$ is smaller than about 1.5 mm, a portion of the display device, at which the base substrate 110 is bent, including the flexible printed circuit board may be lifted. That is, in the case in which the difference $W_d$ of the flexible printed circuit board is smaller than about 1.5 mm, a stress in the bending area may not be sufficiently reduced when the flexible printed circuit board is applied to the display panel having the curved edge.

As shown in FIG. 10, because the edge of the first body part 110a of the base substrate 110 has the curved line shape, the flexible printed circuit board may be applied (e.g., easily applied) to the display panel having the curved surface of the display device. In addition, because the intermediate area between both ends, i.e., the first body part 110a and the second body area 110b-2 of the second body part 110b of the base substrate 110, has a smaller width than those of both ends of the base substrate 110, the stress caused by the bending portion may be reduced (e.g., minimized) even though the flexible printed circuit board is applied to the display device described later.

In addition, the flexible printed circuit board may be prevented or substantially prevented from protruding outward from the curved edge of the display device in the bending area, and thus the curved shape of the display panel may be maintained while being manufactured, thereby realizing the display device of various shapes in terms of design.

Hereinafter, the display device including the aforementioned flexible printed circuit board will be described in detail with reference to the accompanying drawings, and detailed descriptions of the flexible printed circuit board may be omitted in order to avoid redundancy.

Figure 11:
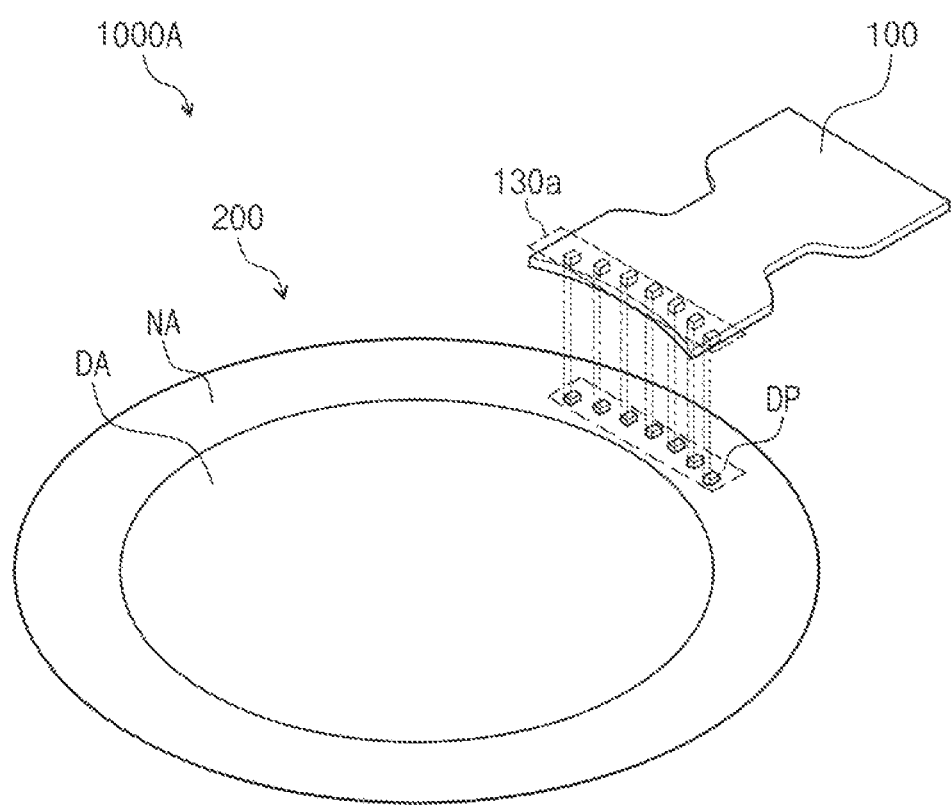
FIG. 11 is an exploded perspective view showing a display device according to an exemplary embodiment of the present disclosure.
Figure 12:
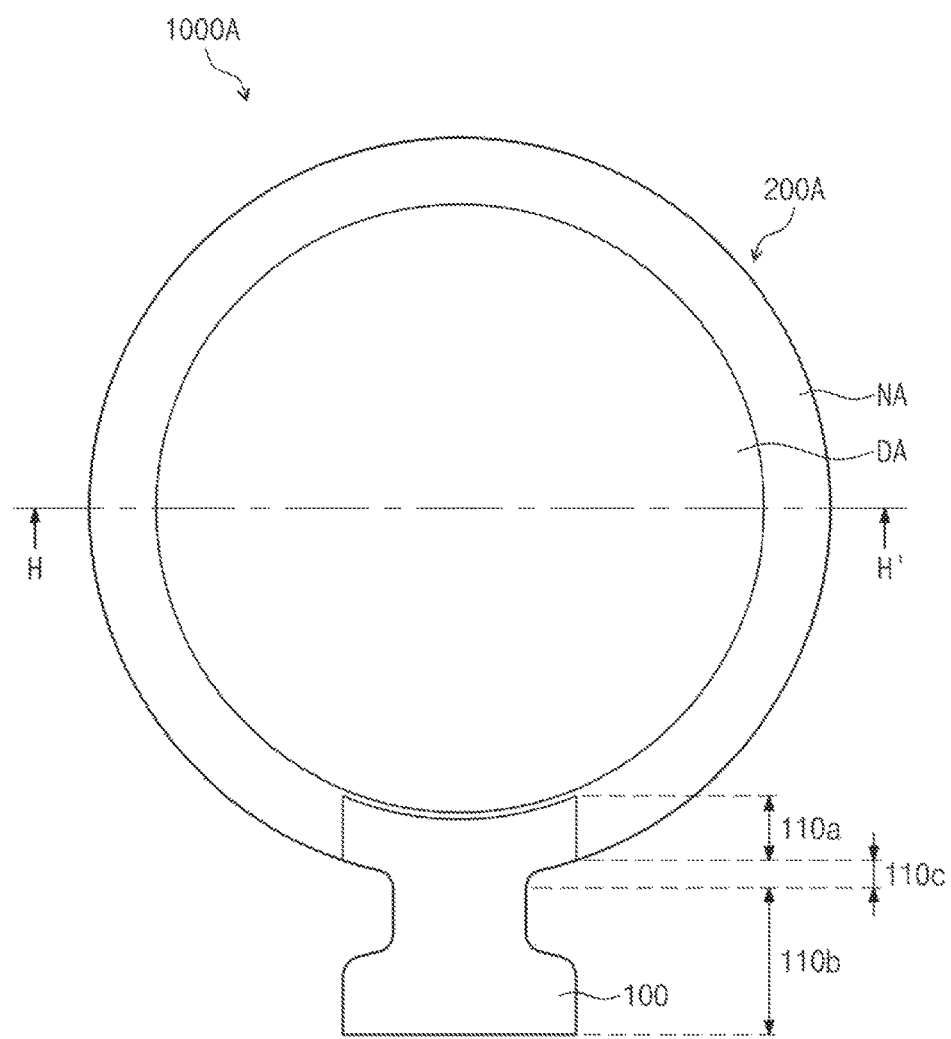
FIG. 12 is a plan view showing a display device according to an exemplary embodiment of the present disclosure.

FIG. 11 is an exploded perspective view showing a display device 1000A according to an exemplary embodiment of the present disclosure and FIG. 12 is a plan view showing the display device 1000A according to an exemplary embodiment of the present disclosure.

The display device 1000A includes a display panel 200A having a curved edge and a flexible printed circuit board 100.

The display panel 200A and the flexible printed circuit board 100 are electrically connected to each other.

The display panel 200A generates an image corresponding to image data input thereto. The display panel 200A may be, but is not limited to, a liquid crystal display panel or an organic light emitting display panel. In the present exemplary embodiment, the organic light emitting display panel will be described as the display panel. Detailed descriptions of the organic light emitting display panel will be given later.

The display panel 200A includes a display area DA for displaying the image and a non-display area NA disposed adjacent to the display area DA. A panel pad part DP including a plurality of panel pads is disposed at a portion of the non-display area NA.

The pads of the panel pad part DP are electrically connected to the pads of the flexible printed circuit board.

For instance, the first pad part 130a of the flexible printed circuit board included in the display device is connected to the panel pad part DP disposed at the curved edge portion of the display panel 200A.

Referring to FIG. 12, the first body part 110a of the flexible printed circuit board 100 is disposed to correspond to the non-display area of the display panel 200A in the display device 1000A.

In the present exemplary embodiment shown in FIG. 12, the pads of the first pad part 130a disposed in the first body part 110a of the flexible printed circuit board 100 are connected to the panel pads of the display panel 200A, respectively, and in this case, the pads of the first pad part 130a, which are connected to the display panel 200A, may be the output pads.

Figure 13:
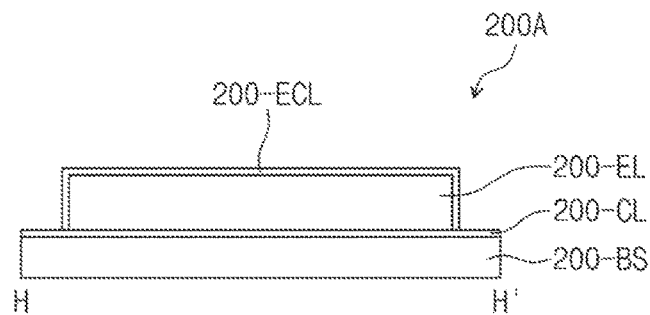
FIG. 13 is a cross-sectional view taken along the line H-H' of FIG. 12 to show the display device of FIG. 12.

FIG. 13 is a cross-sectional view taken along the line H-H' of FIG. 12 to show the display panel 200A of FIG. 12.

Figure 14:
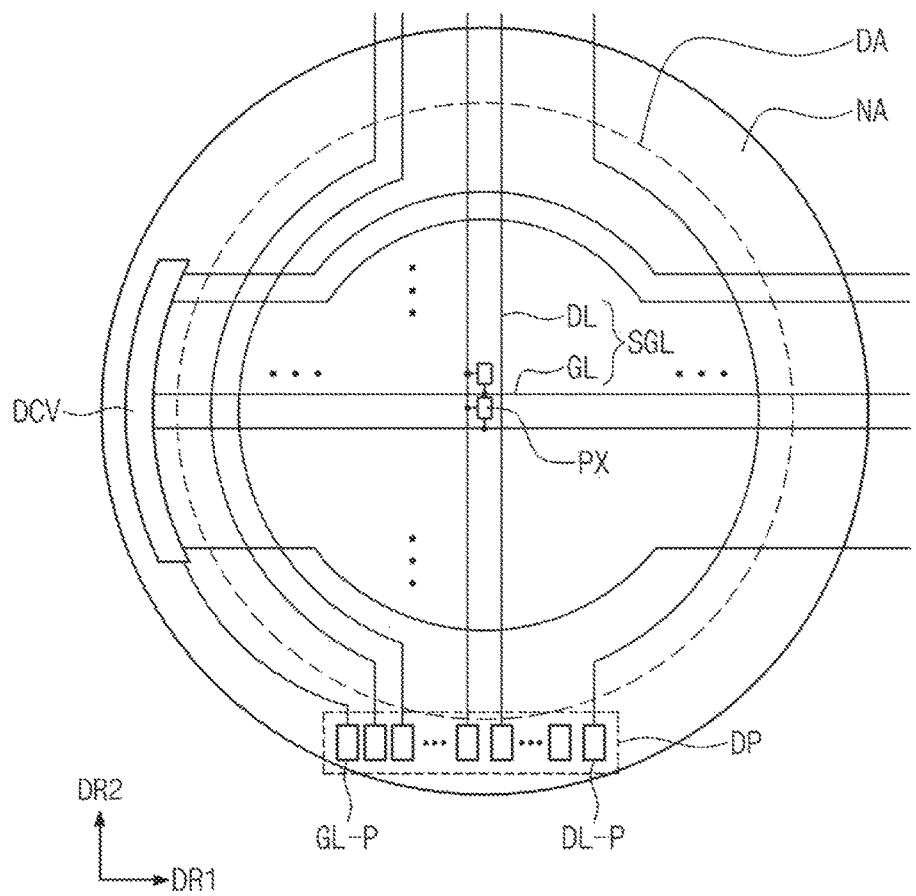
FIG. 14 is a plan view showing a display panel according to an exemplary embodiment of the present disclosure.
Figure 15:
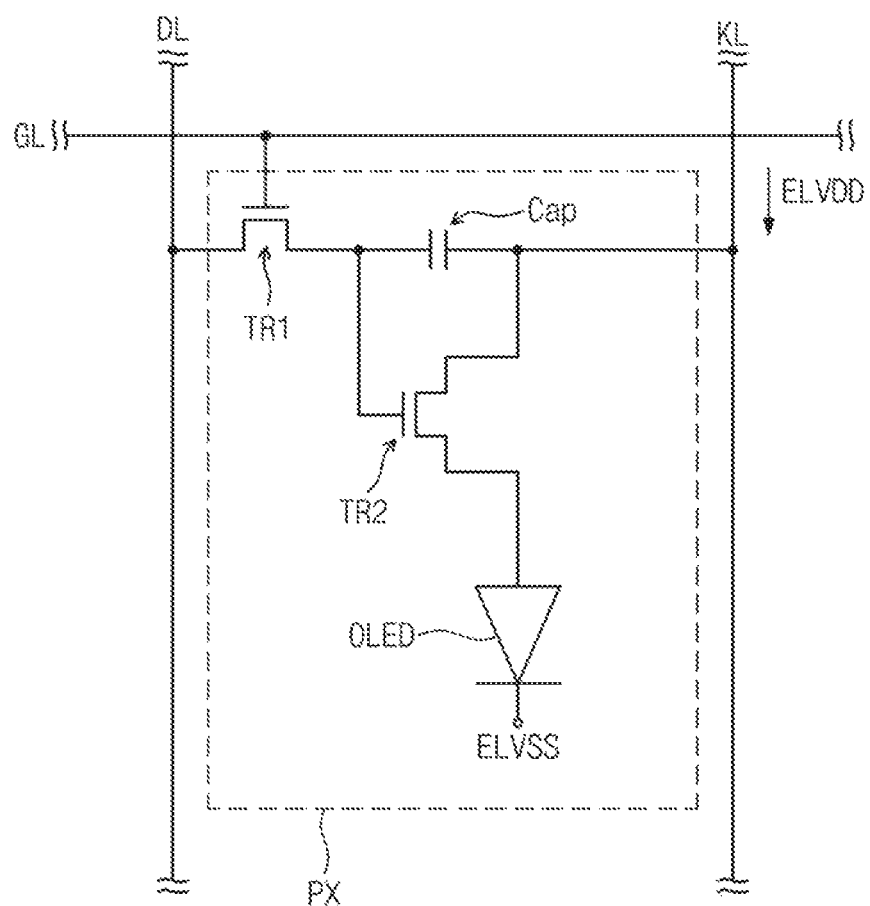
FIG. 15 is an equivalent circuit diagram showing a pixel of a display panel according to an exemplary embodiment of the present disclosure.

In addition, FIG. 14 is a plan view showing a display panel 200A according to an exemplary embodiment of the present disclosure and FIG. 15 is an equivalent circuit diagram showing a pixel PX of a display panel according to an exemplary embodiment of the present disclosure. Hereinafter, the display panel 200A will be described in detail with reference to FIGS. 13 to 15.

Referring to FIG. 13, the display panel 200A includes a base 200-BS, a circuit layer 200-CL, an element layer 200-EL, and an encapsulation layer 200-ECL. The display panel 200A may further include an optical member disposed on the encapsulation layer 200-ECL, e.g., a phase retardation plate, a polarizing plate, etc.

The base 200-BS includes at least one plastic film. The base 200-BS may include two plastic films and inorganic layers disposed between the two plastic films, e.g., a silicon nitride thin film layer and/or a silicon oxide thin film layer. The base 200-BS may include at least one of polyimide (PI), polyethylenenaphthalate (PEN), polyethersulphone (PES), and fiber reinforced plastics (FRP).

Referring to FIGS. 14 and 15, the circuit layer 200-CL includes a plurality of signal lines SGL disposed on the display panel 200A and electronic elements (or components) disposed on the display panel 200A. In addition, the circuit layer 200-CL includes a plurality of insulating layers to insulate the signal lines SGL from the electronic elements (or components).

The circuit layer 200-CL includes the signal lines SGL. The signal lines SGL include gate lines GL arranged in a second direction DR2 and data lines DL arranged in a first direction DR1. Each of the gate lines GL and each of the data lines DL are connected to a corresponding pixel of the pixels PX. The pixels PX each receive a first power supply voltage ELVDD, provided to the pixels via a power line KL, and include an organic light emitting diode OLED connected to a second power supply voltage ELVSS.

The circuit layer 200-CL includes circuits of the pixel PX, e.g., at least one thin film transistor TR1 and/or TR2 and at least one capacitor Cap. The circuit layer 200-CL further includes a gate driving circuit DCV disposed at one side of the non-display area NA.

The gate lines GL and the data lines DL include a gate pad part GL-P and data pad parts DL-P, respectively, which are disposed in the non-display area NA. The gate pad part GL-P and the data pad parts DL-P are connected to the pads of the first pad part 130a of the flexible printed circuit board 100. The display panel 200A is connected to a main driving circuit through the flexible printed circuit board 100.

The element layer 200-EL includes display elements (or components). As shown in FIGS. 14 and 15, the element layer 200-EL includes a thin film encapsulation layer, i.e., a plurality of inorganic thin film layers and a plurality of organic thin film layers. In the present exemplary embodiment, the encapsulation layer 200-ECL may be replaced with an encapsulation substrate. The encapsulation substrate is spaced apart from the base 200-BS such that the element layer 200-EL is disposed between the encapsulation substrate and the base 200-BS. A sealant is provided along an edge of the encapsulation substrate and the base 200-BS to form a space (e.g., a predetermined space).

When viewed in a plan view, the display panel 200A includes a display area DA in which the pixels PX are disposed and the non-display area NA surrounding the display area DA. The area in which the flexible printed circuit board is disposed is defined in a portion of the non-display area NA.

Figure 16:
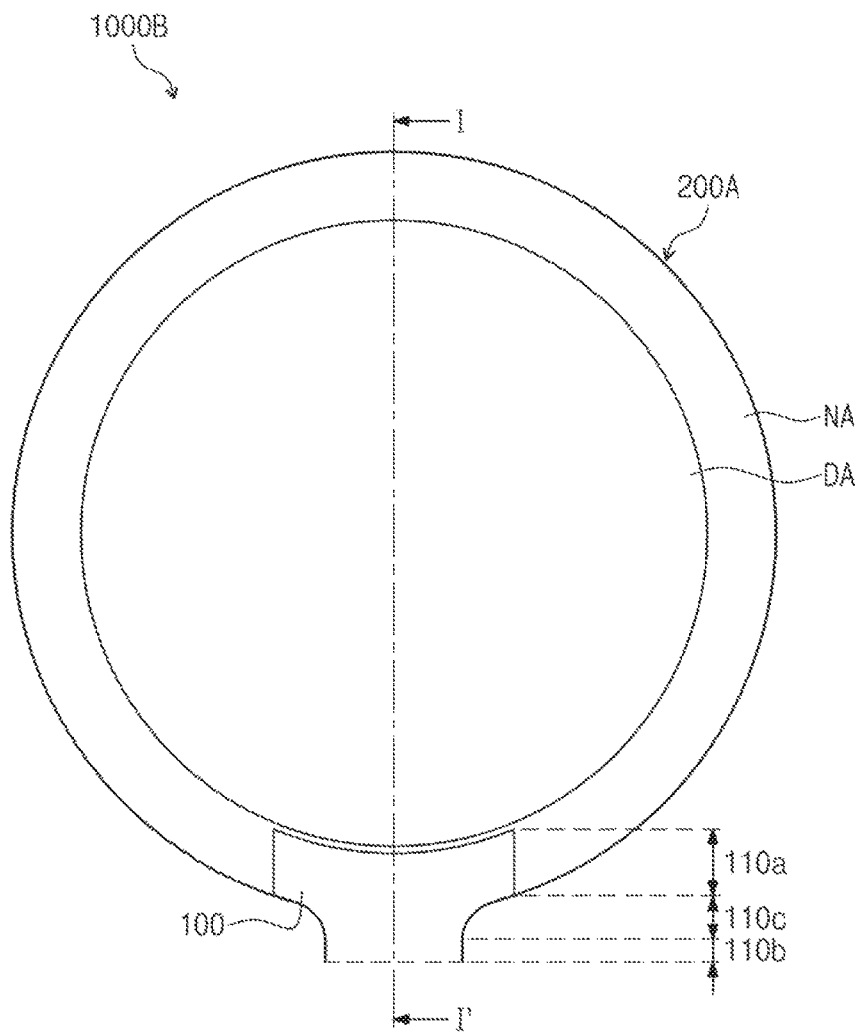
FIG. 16 is a plan view showing a display device according to an exemplary embodiment of the present disclosure.
Figure 17:
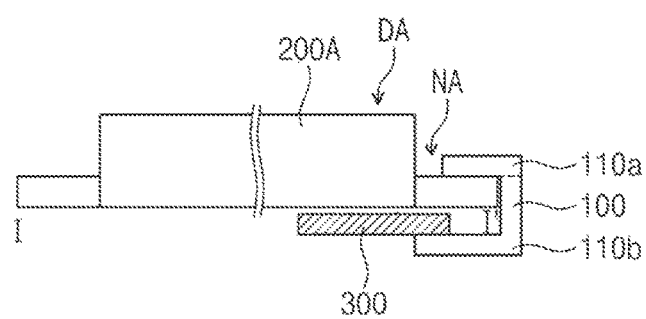
FIG. 17 is a cross-sectional view taken along the line I-I' of FIG. 16 to show the display device of FIG. 16.

FIG. 16 is a plan view showing a display device 1000B according to an exemplary embodiment of the present disclosure and FIG. 17 is a cross-sectional view taken along the line I-I' of FIG. 16 to show the display device 1000B of FIG. 16. In detail, FIG. 16 shows the display device 1000B configured to include the display panel 200A having the curved edge, the flexible printed circuit board 100, and the main circuit board 300.

Referring to FIGS. 16 and 17, the first body part 110a of the flexible printed circuit board 100 is disposed to correspond to the non-display area NA and the second body part 110b is bent such that a portion thereof is disposed on the rear side of the display panel.

The main circuit board 300 is electrically connected to the display panel 200A through the flexible printed circuit board 100. The main circuit board 300 applies image data, a control signal, and the power supply voltages to the display panel 200A or the flexible printed circuit board 100. The main circuit board 300 includes an active device and a passive device. The main circuit board 300 may include a pad part connected to the flexible printed circuit board 100.

In detail, the main circuit board 300 may be electrically connected to the second pad part 130b disposed in the second body part 110b of the flexible printed circuit board 100. In this case, the pads disposed in the second pad part 130b may be the input pads.

The display panel included in the display device described with reference to FIGS. 11 to 17 may have a circular-shaped edge.

However, the display panel may have a partially curved edge rather than the circular-shaped display panel. For instance, the flexible printed circuit board may be applied to an oval display panel or a semi-circular display panel, but it is not limited thereto or thereby.

Figure 18:
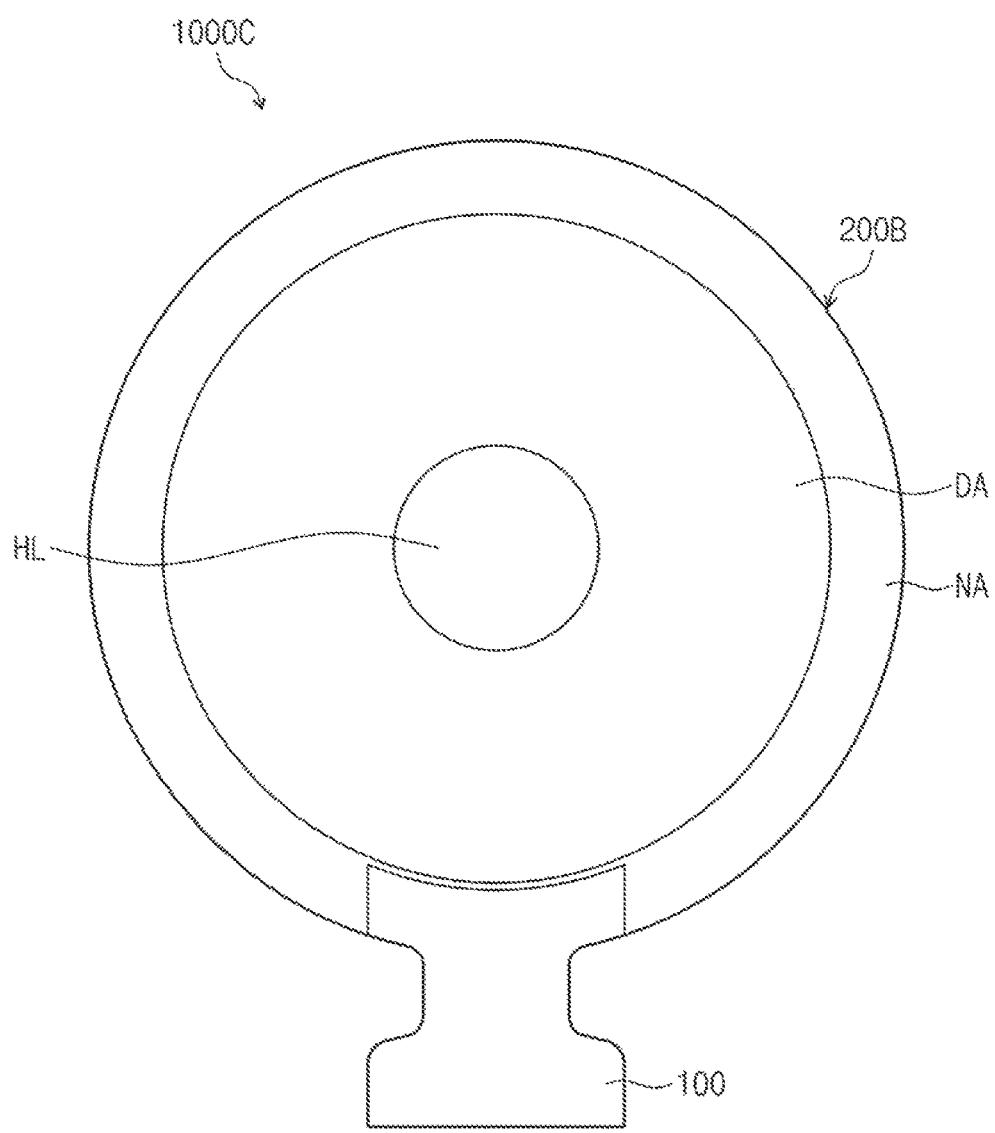
FIG. 18 is a plan view showing a display device according to an exemplary embodiment of the present disclosure.

FIG. 18 is a plan view showing a display device 1000C according to an exemplary embodiment of the present disclosure. Referring to FIG. 18, the display device 1000C includes a display panel 200B and a flexible printed circuit board 100 electrically connected to the display device 1000C.

Referring to FIG. 18, the display panel 200B included in the display device 1000C may have a curved edge and include a display area DA displaying an image and a non-display area NA surrounding the display area DA and disposed outside the display area DA.

In addition, the display panel 200B may include a hole HL formed through a center portion of the display area DA. For instance, the hole HL formed through the display panel 200B may have a disc shape with respect to the center portion of the display area DA.

That is, the display panel 200B included in the display device 1000C shown in FIG. 18 may have a substantially ring shape in which a void is defined through the display panel 200B with respect to the center portion of the display panel 200B. In other words, the display device 1000C may have a substantially donut shape.

The display devices 1000A, 1000B, and 1000C shown in FIGS. 11 to 18 are flat, but they are not limited to the flat shape. That is, the display devices 1000A, 1000B, and 1000C may be a curved display device with a curvature (e.g., a predetermined curvature), a rollable display device, or a foldable display device. The display device may be applied to a large-sized electronic item, such as a television set, an outdoor billboard, etc., and/or a small and medium-sized electronic item, such as a mobile phone, a personal computer, a notebook computer, a personal digital assistant, a car navigation unit, a game unit, a mobile electronic device, a wrist-type electronic device, a camera, etc., but it is not limited thereto or thereby.

For instance, the display devices 1000A, 1000B, and 1000C according to the exemplary embodiments may be applied to equipment having a curved surface, e.g., a smart watch, a car dashboard, etc. In the case in which the display devices 1000A, 1000B, and 1000C according to the exemplary embodiments are applied to the equipment having the curved surface, the flexible printed circuit board 100 included in the display devices 1000A, 1000B, and 1000C may be disposed to correspond to the curved shape of the display devices 1000A, 10006, and 1000C.

In addition, in the case in which the flexible printed circuit board 100 is applied to the edge of the display panel 200A or 200B, the stress may be reduced by the shape of the base substrate 110 configured to include the first body part 110a and the second body part 110b.

Although the exemplary embodiments of the present invention have been described, it is to be understood that the present invention should not be limited to these exemplary embodiments but that various changes and modifications can be made by one of ordinary skill in the art within the spirit and scope of the present invention as defined by the following claims and their equivalents.

What is claimed is:

1. A flexible printed circuit board comprising:
   a base substrate;
   a first pad part on the base substrate;
   a second pad part on the base substrate; and
   a line part on the base substrate, the line part electrically connecting the first pad part and the second pad part,
   the base substrate comprising:
      a first body part comprising the first pad part thereon and having a curved edge;
      a second body part comprising the second pad part thereon; and
      a connection part between the first pad part and the second pad part and having a width decreasing as a distance from the first body part increases and a distance from the second body part decreases,
   wherein the first pad part comprises first pads and second pads, which are on the base substrate,
   wherein the second pad part comprises third pads and fourth pads, which are on the base substrate,
   wherein the line part comprises:
      first lines connecting the first pads and the third pads; and
      second lines connecting the second pads and the fourth pads, and
   wherein at least one second line of the second lines comprises:
      a first portion on one surface of the base substrate;
      a second portion on an other surface of the base substrate; and
      a third portion in a via hole in the base substrate, the third portion connecting the first portion and the second portion.

2. The flexible printed circuit board of claim 1, wherein the second body part comprises:
   a first body area extending from the connection part;
   a second body area at which the second pad part is disposed; and
   a third body area between the first body area and the second body area, the third body area having a width increasing as a distance from the first body area increases and a distance from the second body area decreases.

3. The flexible printed circuit board of claim 1, wherein the first lines and the second lines are on one surface of the base substrate.

4. The flexible printed circuit board of claim 1, wherein the first lines are alternately arranged with the second lines.

5. The flexible printed circuit board of claim 1, wherein the first lines are on the one surface of the base substrate.

6. The flexible printed circuit board of claim 5, wherein at least one line of the first lines and at least one line of the second lines are disposed such that at least portions thereof face each other in a thickness direction of the base substrate.

7. The flexible printed circuit board of claim 1, wherein the first pads, the second pads, and the third pads are on one surface of the base substrate and the fourth pads are on an other surface of the base substrate.

8. The flexible printed circuit board of claim 1, wherein the pads of the first pad part are arranged along the curved edge of the first body part and spaced apart from each other by a first distance, the pads of the second pad part are spaced apart from each other by a second distance, and the second distance is equal to or smaller than the first distance.

9. A display device comprising:
   a display panel comprising a curved edge; and
   a flexible printed circuit board electrically connected to the display panel, the flexible printed circuit board comprising:
      a base substrate;
      a first pad part on the base substrate;
      a second pad part on the base substrate; and
      a line part on the base substrate to electrically connect the first pad part and the second pad part, the base substrate comprising:
         a first body part comprising the first pad part thereon, the first body part having a curved edge;
         a second body part comprising the second pad part thereon; and
         a connection part between the first pad part and the second pad part, the connection part having a width decreasing as a distance from the first body part increases and a distance from the second body part decreases,
      wherein the first pad part comprises first pads and second pads, which are on one surface of the base substrate, and
      wherein the second pad part comprises third pads and fourth pads, the third pads being on the one surface of the base substrate and the fourth pads being on an other surface of the base substrate.

10. The display device of claim 9, wherein the display panel comprises a display area for displaying an image and a non-display area outside the display area, and the first body part of the base substrate corresponds to the non-display area.

11. The display device of claim 9, wherein the display panel comprises a panel pad part at the curved edge and the panel pad part is electrically connected to the first pad part.

12. The display device of claim 9, further comprising a main circuit board electrically connected to the flexible printed circuit board, the first pad part being electrically connected to the display panel and the second pad part being electrically connected to the main circuit board.

13. The display device of claim 9, wherein the edge of the display panel has a circular shape.

14. The display device of claim 13, wherein the display panel is provided with a hole in a center portion thereof and has a substantially ring shape.

15. A display device comprising:
   a display panel comprising a curved edge; and
   a flexible printed circuit board electrically connected to the display panel, the flexible printed circuit board comprising:
      a base substrate;
      a first pad part on the base substrate;
      a second pad part on the base substrate; and
      a line part on the base substrate to electrically connect the first pad part and the second pad part, the base substrate comprising:
         a first body part comprising the first pad part thereon, the first body part having a curved edge;
         a second body part comprising the second pad part thereon; and a connection part between the first pad part and the second pad part, the connection part having a width decreasing as a distance from the first body part increases and a distance from the second body part decreases, wherein the first pad part comprises first pads and second pads, which are on one surface of the base substrate, wherein the second pad part comprises third pads and fourth pads, which are on the one surface of the base substrate, and wherein the line part comprises:
- first lines connecting the first pads and the third pads; and
- second lines connecting the second pads and the fourth pads through via holes in the base substrate.

16. The display device of claim 15, wherein at least one second line of the second lines comprises:
- a first portion on the one surface of the base substrate;
- a second portion on an other surface of the base substrate; and
- a third portion connecting the first portion and the second portion, the third portion being in a corresponding via hole of the via holes in the base substrate.

* * * * *